United States Patent [19]

Sondermeyer

[11] Patent Number: 5,524,055
[45] Date of Patent: Jun. 4, 1996

[54] SOLID STATE CIRCUIT FOR EMULATING TUBE COMPRESSION EFFECT

[75] Inventor: Jack C. Sondermeyer, Meridian, Miss.

[73] Assignee: Peavey Electronics Corporation, Meridian, Miss.

[21] Appl. No.: 182,493

[22] Filed: Jan. 18, 1994

[51] Int. Cl.⁶ .................................................. H03G 3/08
[52] U.S. Cl. ............................................................ 381/61
[58] Field of Search .................................. 381/61; 330/51, 330/255, 262

[56] References Cited

U.S. PATENT DOCUMENTS

| | | | |
|---|---|---|---|
| 4,405,832 | 9/1983 | Sondermeyer | 179/1 D |
| 4,439,742 | 3/1984 | Sondermeyer | 330/262 |
| 4,809,336 | 2/1989 | Pritchard | 381/61 |
| 4,937,847 | 6/1990 | Kruger | 378/62 |
| 4,987,381 | 1/1991 | Butler | 330/255 |
| 4,995,084 | 2/1991 | Pritchard | 379/94 |
| 5,012,199 | 4/1991 | McKale | 330/51 |
| 5,133,014 | 7/1992 | Pritchard | 381/61 |

Primary Examiner—Stephen Brinich
Attorney, Agent, or Firm—Watson Cole Stevens Davis

[57] ABSTRACT

A solid state amplifier for emulating the compression associated with an overbiased class-B push-pull tube amplifier at high input signal levels due to the flow of current into the grid of the output tubes resulting in a desirable output clipping characteristic with crossover distortion is disclosed. The invention includes at least one pair of class-B connected solid state devices, each having an input circuit and an output circuit. The output circuits are connected for mixing. A biasing element in the input circuit of each paired solid state device establishes a clipping level offset at the input circuit and at the output circuit of each device. A clipping element in the input circuit and the output circuit clips the offset at the input circuit and clips the offset at the output circuit of each respective solid state device. A charging element overbiases the offset in the input circuit whenever the input signal is greater than the input clipping element. The overbiasing causes crossover distortion for emulating the desirable compression associated with a tube amplifier.

26 Claims, 3 Drawing Sheets

SOLID STATE CIRCUIT FOR EMULATING TUBE COMPRESSION EFFECT

BACKGROUND OF THE INVENTION

The invention relates to replacement of tubes in power amplifiers with solid state devices. In particular, the invention is directed to a solid state circuit that duplicates tube power amplifier compression.

Tube compression occurs whenever the tube power amplifier is driven into hard clipping. Normally, a solid state amplifier driven into hard clipping creates harsh odd-order harmonic distortion (square waves). In contrast, a tube amplifier compresses the signal so that the level decreases and it does not sound as harsh and strident. As a result, the sound is more subdued, but still has what the players call "punch". Thus, compression is a musical function that gives a tube power amplifier an edge over conventional solid state power amplifiers according to most heavy metal and bass guitar players, particularly at clipping conditions.

The foregoing is a non-technical description of a phenomenon called increased crossover distortion. This function happens in all tube power amplifier designs whenever the output tube grid is driven positive with respect to the cathode causing it to become simply a forward biased diode.

In a typical push-pull configuration, using two class-B biased tubes, the diode in each push-pull output stage causes the average bias level to increase at high signal levels and forces the class-B biased tubes to become over biased. Such condition causes the output signal to have severe crossover distortion, a condition where the signal zero crossing is delayed significantly.

A typical tube power amplifier 10 which has been used on many popular models, is shown in FIG. 1. Typical circuit operation is described below followed by a description of overload (or tube compression) conditions.

In FIG. 1, input signals are coupled via coupling capacitor 11 to the grid of vacuum tube 12 (e.g., 12AX7), which with tube 14 is half of what is called a long tailed phase inverter circuit. In this circuit, the cathodes of tubes 12 and 14 are connected together, as shown. Thus, tube 12 operates in a grounded cathode mode; while tube 14 operates in a grounded grid mode with respect to the input grid of tube 12. Accordingly, equal but out-of-phase signals appear at the plates of 12 and 14. The purpose of the phase inverter is to supply two out-of-phase signals to class-B biased push-pull output tubes 16 and 18.

Cathode resistor 20 sets the bias for each tube 12 and 14. Grid resistors 22 and 24 are the respective grid bias resistors. Resistor 26 is a common cathode resistor. Resistor 28 is used to introduce feedback from the output to reduce overall distortion. The grid of tube 14 is shunted to ground (in this case, the low impedance feedback point) via capacitor 30, as is necessary for grounded grid operation. Load resistors 32 and 34 are the respective plate loads for tubes 12 and 14. The plate signals are coupled to the output tubes 16 and 18 via capacitors 36 and 38.

Each output tube grid is connected to a negative bias source (e.g., −55 V) via bias resistors 40 and 42. This −55 V sources is generated externally from this circuit and is filtered adequately by capacitor 44. Negative 55 volts is chosen as the appropriate value to bias the output tubes 16 and 18 (e.g., 6L6GC) into good class-B operation with minimal crossover distortion at low signal levels.

Completing the circuit, resistor 46 is a feedback resistor; resistors 48 and 50 are power supply decoupling resistors; capacitors 52, 54 and 56 are filter capacitors for the various supply sources in the B+circuit. Finally, transformer 60 is a conventional tube push-pull output transformer, in this case with output taps for 8 and 4 ohms. The power amplifier 10 delivers approximately 50 WRMS to the matching load value.

At all signal levels below output clipping (the output waveform being clean and free of distortion), the signal levels at the grid of each output tube 16 and 18 is well below 55 volts peak swing, and the average DC bias level at each output tube grid is −55 VDC. However, at clipping and beyond, the signal levels at each output tube grid will exceed 55 volts peak swing. Thus, the grid will be biased positive with respect to the cathode at each positive peak signal swing. Whenever the grid is driven positive with respect to the cathode, it becomes a simple forward biased diode. With the positive peak swing clipped, the average negative DC bias voltage level at the grid of each output tube 16 and 18 is increased in proportion to the overload input value above the clipping value. Thus, the output tubes 16 and 18 become over biased beyond class-B and at severe output clipping significant crossover distortion is generated as well. Consequently, at overload, the output signal of tube amplifier 10 will be clipped at the peaks. However, it will not be as "dirty" as a typical solid state power amplifier operating under the same conditions, because a large portion of the overloaded output waveform is forced or compressed into the severe crossover distortion region. To a musician, such a waveform is much more musical in nature and "cleaner" (i.e., less harsh) than a solid state amplifier at overload. Due to the compression (i.e., distortion near the zero crossover), the actual peak output clipping is reduced and is far more tolerable than that of the solid state amplifier. This phenomenon is thus, tube power amplifier compression.

SUMMARY OF THE INVENTION

The present invention is directed to a solid state amplifier for emulating the compression associated with an overbiased class-B push-pull tube amplifier at high input signal levels due to the flow of current into the grid of the output tubes resulting in a desirable output clipping characteristic with crossover distortion. The invention includes at least one pair of class-B connected solid state devices. Each device has an input circuit and an output circuit. The output circuits are connected for mixing. Biasing means in the input circuit of each paired solid state device establishes a clipping level offset at the input circuit and at the output circuit of each device. Clipping means in the input circuit and in the output circuit clips the offset at the input circuit and the offset at the output circuit of each respective solid state device. Charging means overbiases the offset in the input circuit whenever the input signal is greater than said input clipping means, said overbiasing causing crossover distortion for emulating the desirable compression associated with a tube amplifier.

DESCRIPTION OF THE INVENTION

Figure 1:
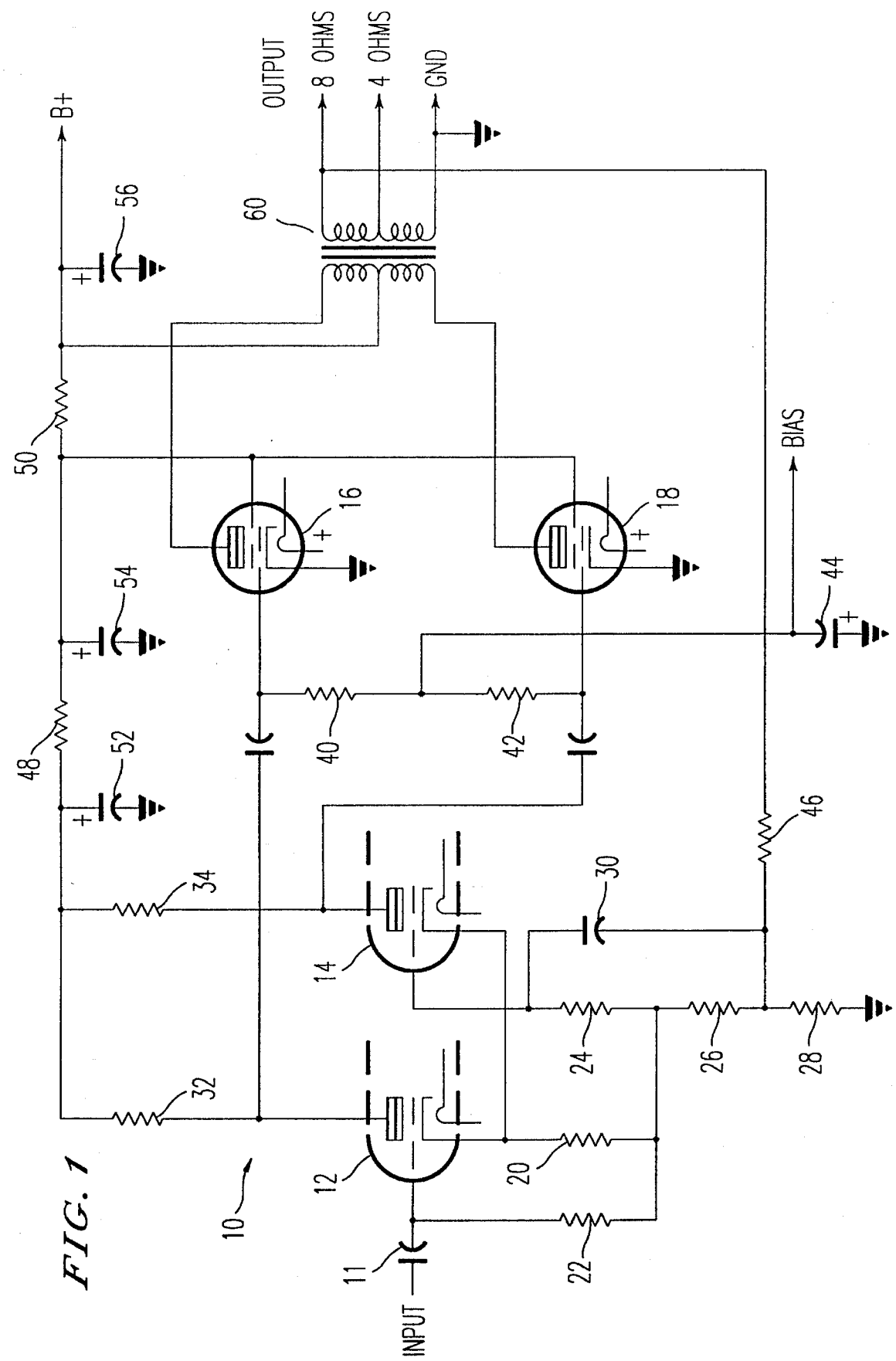
FIG. 1 is a schematic diagram of a known class-B tube amplifier circuit.
Figure 2:
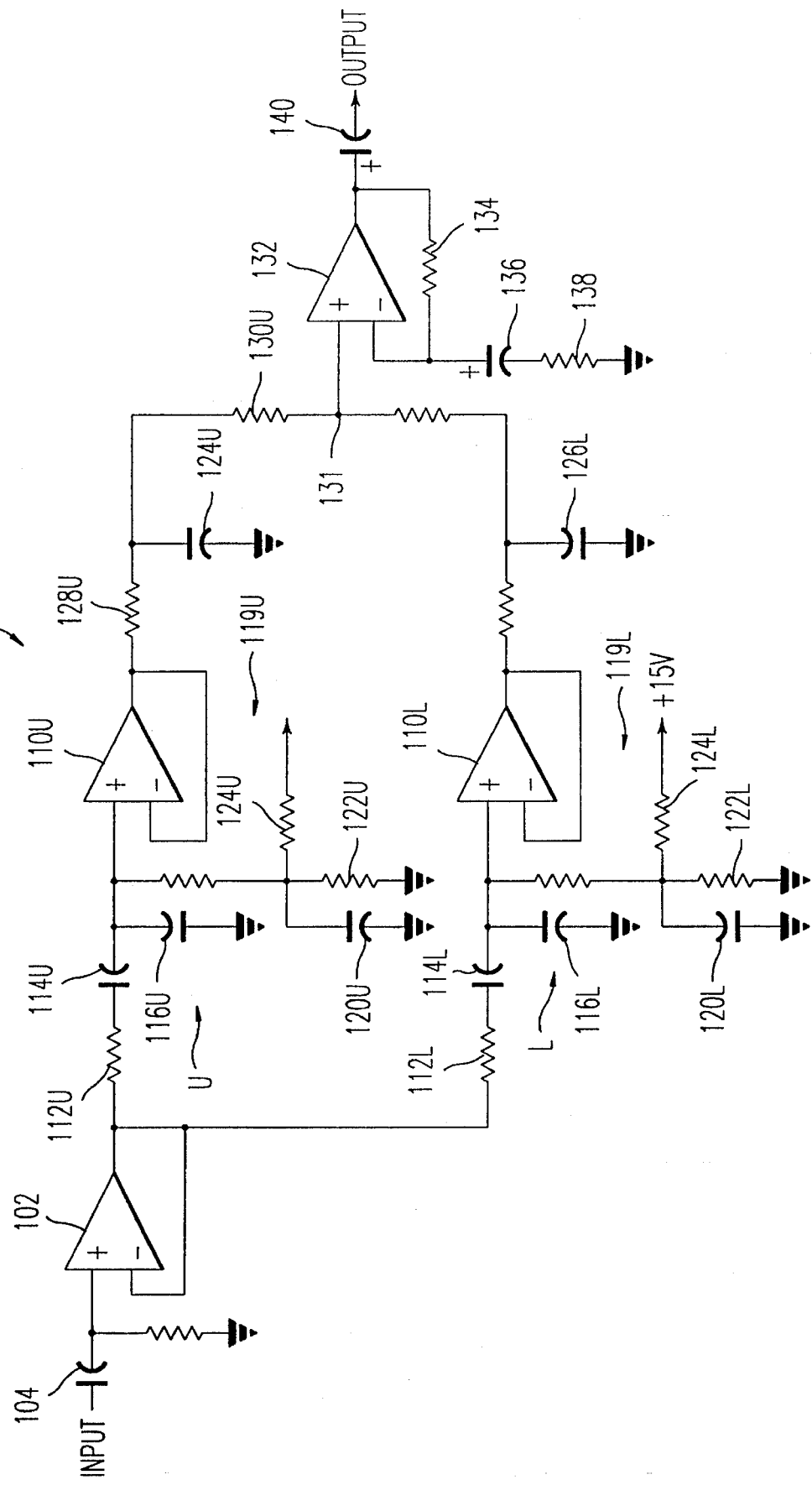
FIG. 2 is a schematic diagram of a solid state amplifier which emulates tube compression in accordance with the present invention.

A solid state emulator 100 of the invention is shown in FIG. 2. Input signal is coupled to an operational amplifier (OP AMP) 102 via coupling capacitor 104 with resistor 106 providing a reference to ground. The output of amplifier 102 drives upper and lower circuits U and L including class-B biased, push-pull connected emulator operational amplifiers 110U and 110L. Each OP AMP circuit 110U and 110L is a unity gain stage that duplicates one of the output tubes 16 and 18 in the push-pull tube power amplifier 10 shown in FIG. 1. The OPAMP emulator circuits 110U and 110L are identical except for the diode directions discussed hereinafter. Thus, the reference numbers and designations U and L will be used only where necessary. The upper circuit U is discussed below followed by a discussion of the differences in the lower circuit L.

In the upper circuit U, the output of amplifier 102 is coupled to amplifier 110 via resistor 112 and capacitor 114. A diode 116 is coupled to ground at the input of amplifier 110. A resistor 118 is coupled to an upper bias circuit 119 comprising the parallel combination of diode 120 and resistor 122 to ground, in series with resistor 124 to the −15 volt supply. The output of amplifier 110 is applied to diode 126 via resistor 128. The signal at diode 126 (i.e., the output of the upper circuit U) is mixed with signal from the lower circuit L via resistors 130U and 130L. The mixed outputs are then amplified by output amplifier 132 which is a non-inverting gain stage with a feedback resistor 134, a ground circuit including capacitor 136 and series resistor 138, and output coupling capacitor 140. In order to provide a greater offset voltage the diodes 120 and 126 may be multiple diodes in series (not shown).

In the exemplary embodiment illustrated, the upper bias circuit 119 creates −0.6 volts at the cathode of diode 120), and this bias is applied to the input of amplifier 110 via resistor 118. This −0.6 volt input bias offsets the output of amplifier 110 at the same amount. Further, this offset is applied to diode 126 through resistor 128. Thus, output circuit diode 126 is biased into slight forward conduction at idle. The lower emulator circuit L is identical to the upper circuit U except that the direction of diodes 116L, 120L and 126L are reversed or complimentary to the diodes 116U, 120U and 126U. All other elements are the same.

Figure 3A:
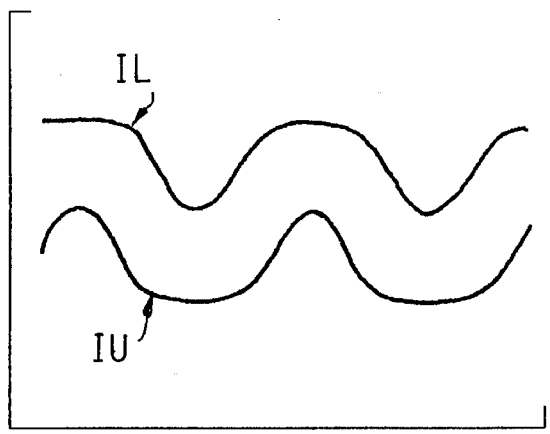
FIGS. 3A–3F are waveform diagrams illustrating tube amplifier compression emulation of the present invention.

A low level input signal, e.g., a 1 volt peak sine wave, is coupled in the upper circuit U via resistor 112 and capacitor 114 to the input circuit of amplifier 110U. The input is offset −0.6 VDC. The applied signal has a negative peak value of −1.6 volts and a positive peak value of +0.4 volts. Diode 116, whose cathode is at ground, is reversed biased at the negative peak swing, and is forward biased at the positive peak swing. However, diode 116 does not conduct in the forward direction because the peak swing is only +0.4 volts and diode conduction begins at +0.6 volts. The same signal swing occurs at the output of amplifier 110 because it has a unity gain. The output signal is then applied to diode 126 in the output circuit, which as noted above, is already biased at idle into a slight forward conduction. Hence, diode 126 clips the negative swing because it is forward biased for this swing, and it allows the positive swing to pass, because it is biased below 0.6 volts forward and is in effect ultimately reverse biased. The resulting waveform is shown in FIG. 3A as curve IU. The waveform is a clean half sine wave in the positive direction and a clipped half sine wave in the negative direction.

Figure 3D:
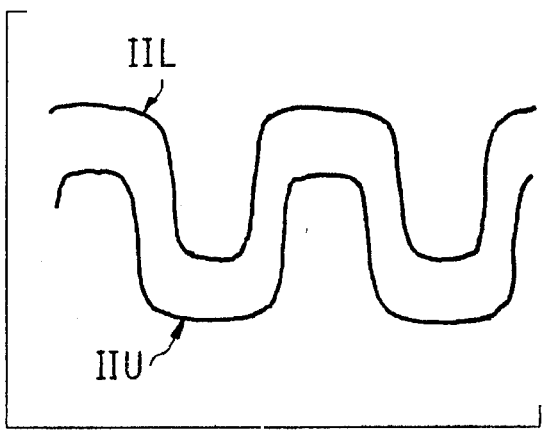
Figure 3B:
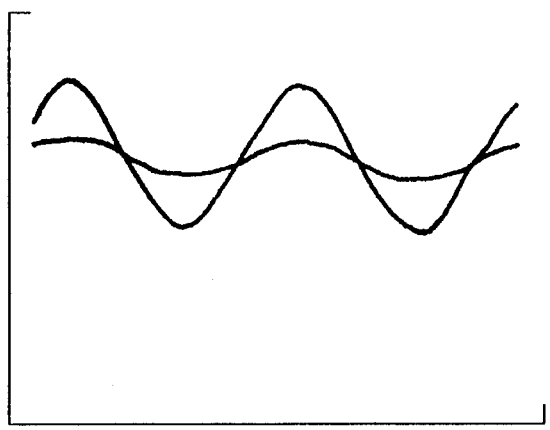
Figure 3E:
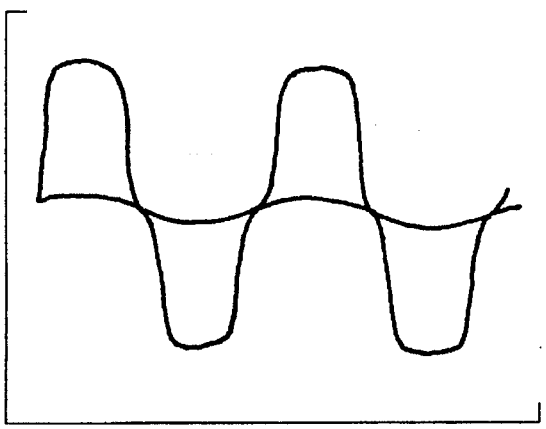
Figure 3C:
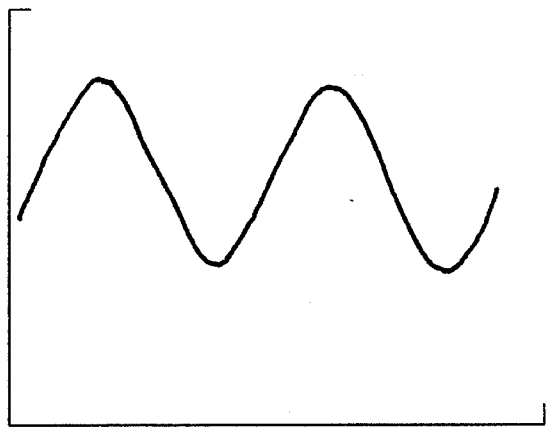

The lower emulator circuit L using lower amplifier 110L is identical except all the diodes are reversed and lower the bias circuit 119L consisting of diode 120L, and resistors 118L, 122L and 124L therein creates +0.6 volts at the anode of diode lower 126L (0.6 volts being the typical forward drop of the diode). In the lower circuit L the bias is applied to the input of lower amplifier 110L via resistor 118L. This +0.6 volt input bias then also offsets the output of amplifier 110L by the same amount. Further, this offset is applied to diode 126 through resistor 128. Thus, diode 126 is biased into slight forward conduction at idle. A 1 volt peak sine wave applied to this lower emulator circuit L is thus opposite the upper emulator circuit U. As a result, a clean half sine wave is produced in the negative direction and a clipped half sine wave is produced in the positive direction. This waveform is shown in FIG. 3A as curve IL. The two emulated waveforms IL and IU are mixed together at node 131 creating a relatively clean sine wave as shown in FIG. 3C. To appreciate how these combine FIG. 3B shows IL and IU superimposed.

At high level signals in the upper circuit U, e.g., at a 3 volt peak sine wave, the input signal is coupled via resistor 112 and capacitor 114 to the input of upper amplifier 110. The input is offset −0.6 VDC. If diode 116 were not present, the applied signal would have a negative peak value of −3.6 volts and a positive peak value of +2.4 volts. However, with diode 116 present and with its cathode grounded, it is reversed biased at the negative peak swing, and forward biased at the positive peak swing. Thus, diode 116 conducts in the forward direction because the peak swing is greater than +0.6 volts. Accordingly, diode 116 limits the peak swing to +0.6 volts and clips the positive waveform somewhat. Capacitor 114 charges in the negative direction to allow the 3 volt peak sine wave to pass with a positive peak value of 0.6 volts and a negative peak value of approximately −4.6 volts. At this condition, the average bias is −1.6 VDC rather than −0.6 VDC. Hence, the upper emulator circuit U is over-biased for these signal conditions.

As noted above, the same signal swing occurs at the output of amplifier 110 as is at the input, because the amplifier is a unity gain stage. This signal is then applied to output diode 126, which is already biased at zero crossing into a heavy forward conduction due to the over-biased conditions. Hence, diode 126 clips the negative swing, (because it is forward biased for this swing) and it clips that portion of the positive swing for which it is over-biased. Diode 126 then allows the remaining positive swing to pass because it is biased below 0.6 volts forward and then is ultimately reverse biased. The resulting signal is thus asymmetrical, having spent more time in the negative swing than the positive swing. This waveform is shown in FIG. 3D as curve II U. The signal is a partial clipped half sine wave in the positive direction and a fully clipped half sine wave in the negative direction with significant asymmetry.

Figure 3F:
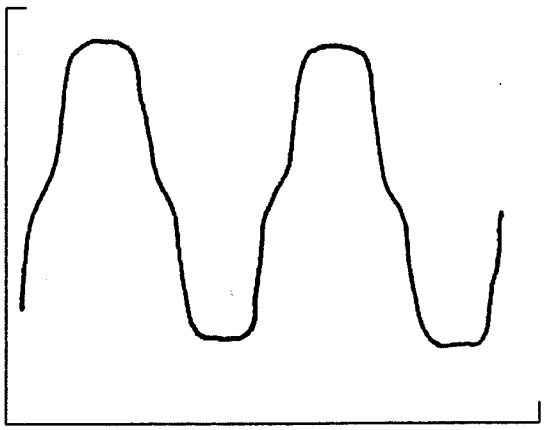
Figure 2:
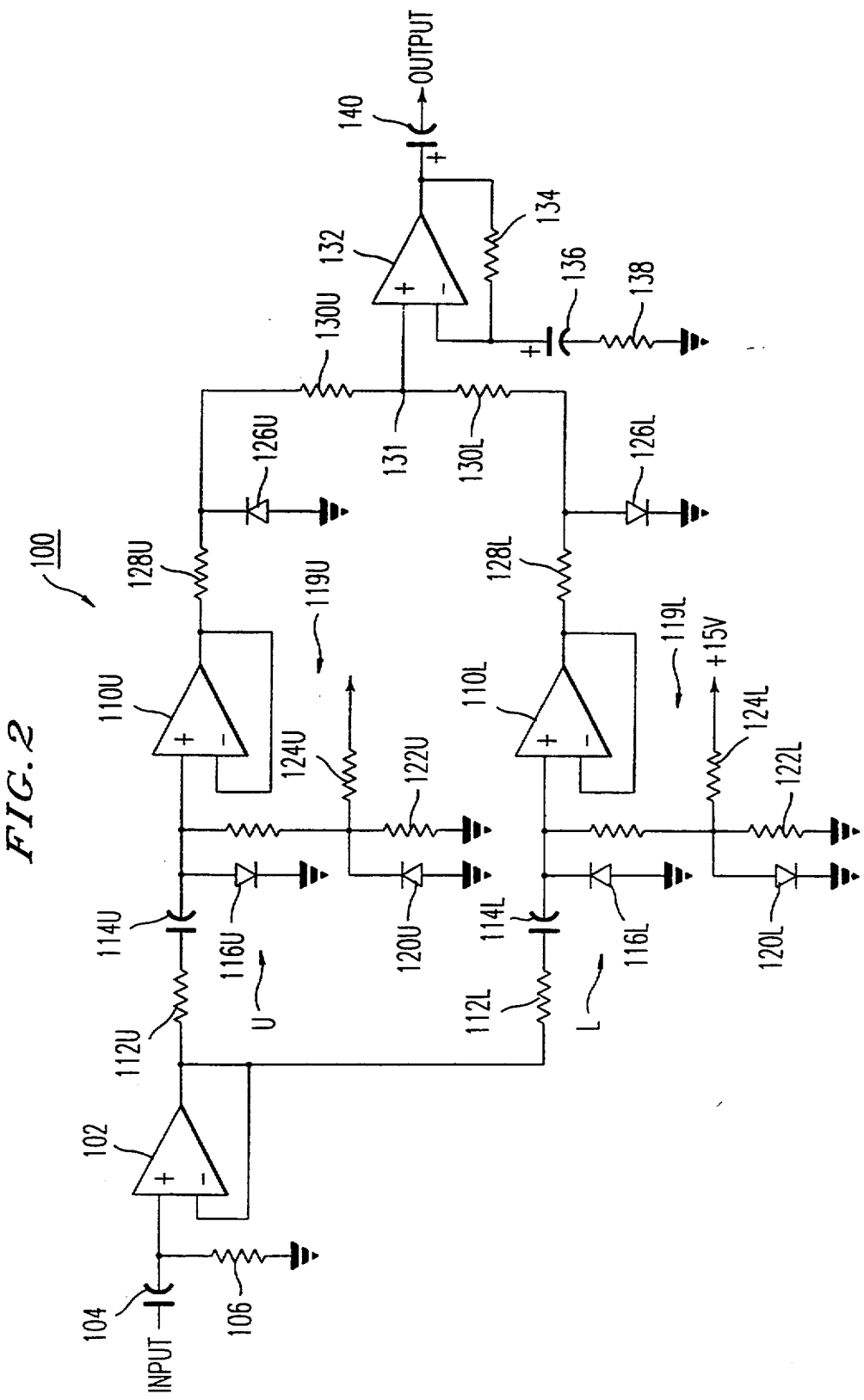

The lower emulator circuit L using lower amplifier 110 is identical except all the diodes are reversed. Thus, it should be clear that a 3 volt peak sine wave applied to the lower emulator circuit L will be opposite the upper one. A partially clipped half sine wave in the negative direction and a fully clipped half sine wave in the positive direction with significant asymmetry results. This waveform is shown in FIG. 3D as curve IIL. Mixing these two emulated waveforms together at node 131 creates a clipped sine wave with considerable crossover distortion as shown in FIG. 3F. To appreciate how these combine, FIG. 3E shows the signals IIU and IIL superimposed.

It is useful to point out the components in the circuits of FIGS. 1 and 2 that perform the same functions or act in the same manner:

1: Resistors 32 and 34 (Tube) and Resistors 112U and 112L (SS) are source resistors for the clipping function.
2: 36, 38 (Tube) and 114U, 114L (SS) are the coupling capacitors that charge to overbias.
3: 40, 42 (Tube) and 118L, 118U (SS) are the bias source resistors.
4: Grid of 16, grid of 18 (Tube) and diodes 116U, 116L (SS) provide the input clipping mechanism.
5: 16, 18 in push/pull (Tube) and diodes 126L, 126U (SS) correspond as follows, in the tube amplifier, each output tube supplies one polarity signal swing to the output. In the solid state amplifier, the diodes remove the unwanted polarity output swing. In the tube amplifier, the input signal is split into two out-of-phase signals to drive identical output tubes in push-pull via the output transformer. In the solid state amplifier, identical input signals are applied to two emulators which are polarity reversed, and the output signals are summed.

Finally, tube compression has a certain attack and decay which is how fast the compression happens and how long it takes to stop. The solid state emulator 100 acts in a similar manner. Additionally, depending upon input waveform, different overbias conditions can occur on each signal half cycle in the tube amplifier. Similarly, the solid state emulator 100 can also overbias in a similar manner.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

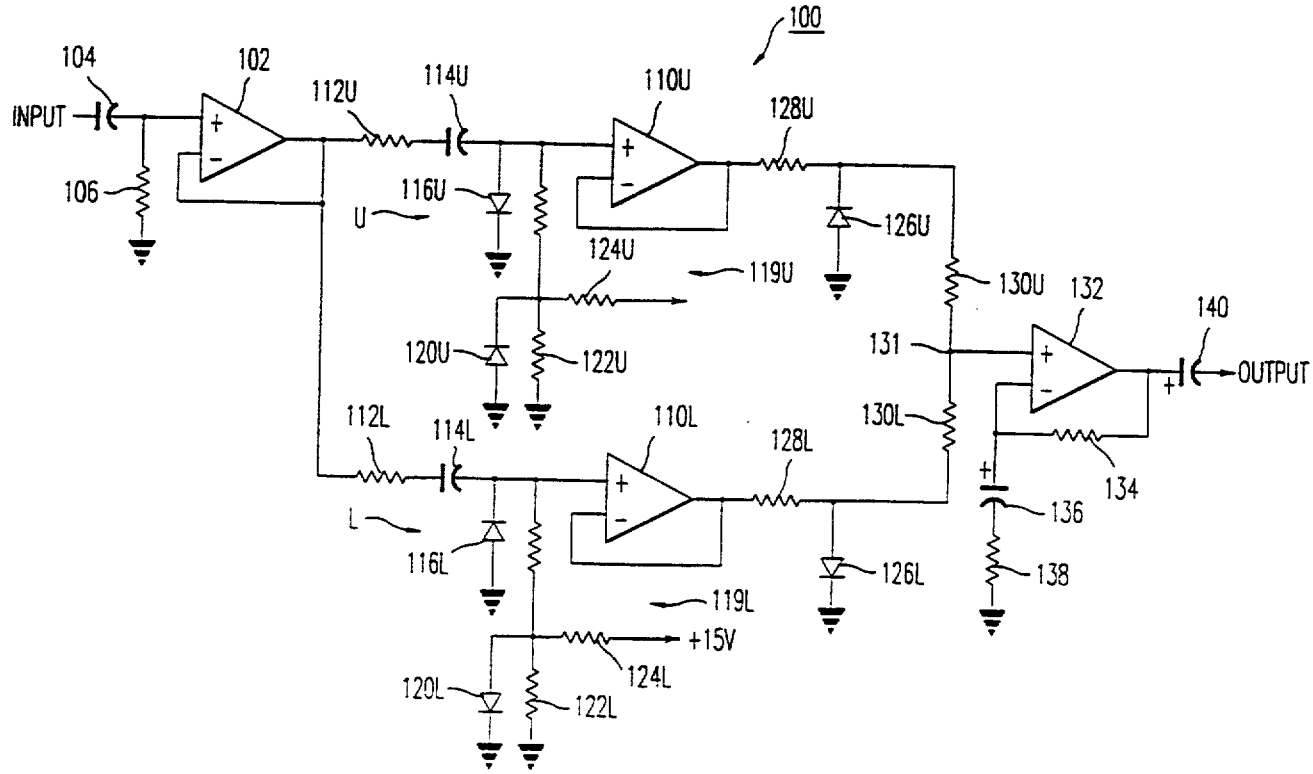

What is claimed is:

1. A solid state amplifier for emulating the compression effect associated with an overbiased class-B push-pull tube amplifier at high input signal levels due to a flow of current into the grid of the output tubes resulting in a desirable output clipping characteristic with crossover distortion comprising:

at least one pair of class-B connected solid state devices, each including an input circuit and output circuit, the output circuit and said at least one pair being connected for mixing;

biasing means in the input circuit of each paired solid state device for establishing an offset level at the input circuit and the output circuit of each device;

clipping means in the input circuit and in the output circuit each having a respective clipping level relative to the offset level for clipping signals at the input circuit and clipping signals at the the output circuit of each solid state device;

charging means for overbiasing the input circuit whenever the input signal is greater than said input clipping level, said overbiasing causing crossover distortion, emulating the desirable compression effect associated with a tube amplifier.

2. The amplifier of claim 1 wherein the biasing means in the input circuit of said pair of solid state devices comprise complimentary diodes.

3. The amplifier of claim 1 wherein the biasing means in the input circuit of each solid state device includes a diode and a resistor network coupled to the input circuit.

4. The amplifier of claim 1 wherein the clipping means in the input circuit and the output circuit comprise complimentary connected diodes.

5. The amplifier of claim 1 wherein the solid state devices comprise operational amplifiers.

6. The amplifier of claim 1 wherein the charging means comprises a resistor capacitor network in the input circuit of each solid state device.

7. The amplifier of claim 1 further comprising input amplifier means commonly coupled to the input circuit of each solid state device.

8. The amplifier of claim 1 further comprising output amplifier means commonly coupled for receiving the mixed output of the output circuits.

9. The amplifier of claim 1 wherein the offset level at the input equals at least one diode voltage drop and the offset in the output circuit equals said at least one diode voltage drop.

10. The amplifier of claim 1 wherein the gain of each solid state device is unity.

11. The amplifier of claim 1 wherein the clipping means in the input clips signals greater than the clipping level plus the offset level.

12. The amplifier of claim 1 wherein the clipping means in the output circuit clips unused opposite half cycles of the input signals.

13. A solid state amplifier comprising:

a pair of solid state devices, each having an input circuit and an output circuit, the output circuits being connected for mixing;

offset means in the input circuit of each solid state device for establishing an offset level at the input circuit and at the output circuit of each device;

clipping means having a clipping level relative to the offset level in the input circuit for clipping input signals relatively greater than the clipping level plus the offset level;

charging means for overbiasing the input circuit whenever the input signal is greater than said offset level and said clipping level, said overbiasing causing crossover distortion.

14. The amplifier of claim 13 wherein the offset means comprises complimentary connected diodes, one each in the input circuit of each solid state device.

15. The amplifier of claim 13 wherein the offset means in the input circuit of each solid state device includes a diode coupled to the input circuit.

16. The amplifier of claim 15 wherein the offset means further comprises a resistor in series with the solid state device.

17. The amplifier of claim 13 wherein the clipping means in the input circuit comprises complimentary connected diodes.

18. The amplifier of claim 13 wherein the charging means comprises a resistor and capacitor network in the input circuit of each solid state device.

19. The amplifier of claim 13 further comprising input amplifier means commonly coupled to the input circuit of each solid state device.

20. The amplifier of claim 13 further comprising output amplifier means commonly coupled for receiving the mixed outputs of the output circuits.

21. The amplifier of claim 13 wherein the offset at the input equals at least one diode voltage drop.

22. The amplifier of claim 13 wherein the gain of each solid state device is unity.

23. The amplifier of claim 13 wherein the offset means establishes an offset in the output circuit.

24. The amplifier of claim 22 wherein the offset in the output circuit equals at least one diode voltage drop.

25. The amplifier of claim 13 further including means at the output of each solid state device for clipping unused opposite half cycles of the input signals.

26. The amplifier of claim 25 wherein the means at the output of each solid state device comprises a diode forward biased with respect to the input for clipping opposite half cycles of the input signal to each solid state device.

* * * * *

UNITED STATES PATENT AND TRADEMARK OFFICE
CERTIFICATE OF CORRECTION

PATENT NO. : 5,524,055  
DATED : June 4, 1996  
INVENTOR(S) : Jack C. Sondermeyer Page 1 of 3

It is certified that error appears in the above-indentified patent and that said Letters Patent is hereby corrected as shown below:

The title page, showing an illustrative figure, should be deleted and substitute therefor the attached title page.

Delete Drawing Figure 2, and substitute therefor the Drawing Sheet, consistign of Fig. 2, as shown on the attached pages.

Signed and Sealed this

Eighth Day of October, 1996

*Attest:*

BRUCE LEHMAN

*Attesting Officer*   Commissioner of Patents and Trademarks

United States Patent [19]

Sondermeyer

[11] Patent Number: 5,524,055
[45] Date of Patent: Jun. 4, 1996

[54] SOLID STATE CIRCUIT FOR EMULATING TUBE COMPRESSION EFFECT

[75] Inventor: Jack C. Sondermeyer, Meridian, Miss.

[73] Assignee: Peavey Electronics Corporation, Meridian, Miss.

[21] Appl. No.: 182,493

[22] Filed: Jan. 18, 1994

[51] Int. Cl.[6] ............................................. H03G 3/08
[52] U.S. Cl. ........................................................... 381/61
[58] Field of Search ................................. 381/61; 330/51, 330/255, 262

[56] References Cited

U.S. PATENT DOCUMENTS

| | | | |
|---|---|---|---|
| 4,405,832 | 9/1983 | Sondermeyer | 179/1 D |
| 4,439,742 | 3/1984 | Sondermeyer | 330/262 |
| 4,809,336 | 2/1989 | Pritchard | 381/61 |
| 4,937,847 | 6/1990 | Kruger | 378/62 |
| 4,987,381 | 1/1991 | Butler | 330/255 |
| 4,995,084 | 2/1991 | Pritchard | 379/94 |
| 5,012,199 | 4/1991 | McKale | 330/51 |
| 5,133,014 | 7/1992 | Pritchard | 381/61 |

*Primary Examiner*—Stephen Brinich
*Attorney, Agent, or Firm*—Watson Cole Stevens Davis

[57] ABSTRACT

A solid state amplifier for emulating the compression associated with an overbiased class-B push-pull tube amplifier at high input signal levels due to the flow of current into the grid of the output tubes resulting in a desirable output clipping characteristic with crossover distortion is disclosed. The invention includes at least one pair of class-B connected solid state devices, each having an input circuit and an output circuit. The output circuits are connected for mixing. A biasing element in the input circuit of each paired solid state device establishes a clipping level offset at the input circuit and at the output circuit of each device. A clipping element in the input circuit and the output circuit clips the offset at the input circuit and clips the offset at the output circuit of each respective solid state device. A charging element overbiases the offset in the input circuit whenever the input signal is greater than the input clipping element. The overbiasing causes crossover distortion for emulating the desirable compression associated with a tube amplifier.

26 Claims, 3 Drawing Sheets